United States Patent
Nien

(10) Patent No.: US 11,514,975 B2
(45) Date of Patent: Nov. 29, 2022

(54) AMPLIFIER AND LPDDR3 INPUT BUFFER

(71) Applicant: Elite Semiconductor Microelectronics Technology Inc., Hsinchu (TW)

(72) Inventor: Shu-Han Nien, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 155 days.

(21) Appl. No.: 17/206,090

(22) Filed: Mar. 18, 2021

(65) Prior Publication Data

US 2022/0301616 A1  Sep. 22, 2022

(51) Int. Cl.
*G11C 11/4093* (2006.01)
*H03F 3/45* (2006.01)
*H03F 1/02* (2006.01)

(52) U.S. Cl.
CPC ............ *G11C 11/4093* (2013.01); *H03F 1/02* (2013.01); *H03F 3/45269* (2013.01)

(58) Field of Classification Search
CPC ............................. G11C 11/4093; H03F 1/02
USPC ........................................................ 365/207
See application file for complete search history.

(56) References Cited

U.S. PATENT DOCUMENTS

| | | |
|---|---|---|
| 6,456,155 B2 | 9/2002 | Takai |
| 7,525,381 B2 | 4/2009 | Murden |
| 2004/0247036 A1 | 12/2004 | Hedberg |
| 2010/0033464 A1* | 2/2010 | Shimatani ........... H03F 3/45192 330/253 |
| 2011/0242145 A1* | 10/2011 | Nishimura ........... G09G 3/3688 330/257 |
| 2018/0152156 A1 | 5/2018 | Shih |
| 2019/0103840 A1 | 4/2019 | Chiu |

FOREIGN PATENT DOCUMENTS

| | | |
|---|---|---|
| WO | 2012/101467 A1 | 8/2012 |
| WO | 2020/186333 A1 | 9/2020 |

* cited by examiner

*Primary Examiner* — Anthan Tran
(74) *Attorney, Agent, or Firm* — Winston Hsu

(57) ABSTRACT

An amplifier with an input stage comprising: a first current mirror; a first input differential pair; a first current source; a second current source; a second input differential pair, wherein the first input differential pair and the second input differential pair receive a reference voltage; a second current mirror; and a voltage control transmission circuit. An extra current path in the first current mirror is formed and a current flowing through the extra current path flows through the second current mirror to a ground when the reference voltage is higher than a first predetermined value. Also, an extra current path in the second current mirror is formed and a current flowing through the extra current path in the second current mirror flows to the first current mirror when the reference voltage is lower than a second predetermined value.

18 Claims, 5 Drawing Sheets

AMPLIFIER AND LPDDR3 INPUT BUFFER

BACKGROUND OF THE INVENTION

1. Field of the Invention

The present invention relates to an amplifier and an LPDDR3 input buffer, and particularly relates an amplifier and an LPDDR3 input buffer which can reduce the interference caused by variation of the reference voltage.

2. Description of the Prior Art

An input buffer for LPDDR3 (low power DDR3) may receive a reference voltage, based on which the input buffer generates an output voltage for following circuits. However, the output voltage may drift due to the variation of the reference voltage.

Therefore, a compensation mechanism for such issue is needed.

SUMMARY OF THE INVENTION

Therefore, one embodiment of the present invention is to provide an amplifier which can compensate drift of an output voltage caused by the variation of the referent voltage.

Another embodiment of the present invention is to provide an LPDDR3 input buffer which can compensate drift of an output voltage caused by the variation of the referent voltage.

One embodiment of the present application discloses amplifier with an input stage, wherein the input stage comprises: a first current mirror, coupled to a predetermine voltage source; a first input differential pair, coupled to the first current mirror; a first current source, coupled to the first input differential pair; a second current source; a second input differential pair, coupled to the second current source, wherein the first input differential pair and the second input differential pair are configured to receive a reference voltage; a second current mirror, coupled to the second input differential pair and a ground; and a voltage control transmission circuit, controlled by a reference voltage, wherein an extra current path in the first current mirror is formed and a current flowing through the extra current path flows through the second current mirror to the ground when the reference voltage is higher than a first predetermined value, wherein an extra current path in the second current mirror is formed and a current flowing through the extra current path in the second current mirror flows to the first current mirror to the predetermined voltage source when the reference voltage is lower than a second predetermined value.

In one embodiment, the extra current path means the first current mirror CM1 and the second current mirror CM2 already have at least one current path there between, but extra current path is formed when the reference voltage is higher than a first predetermined value or lower than a second predetermined value.

In one embodiment, the above-mentioned amplifier is applied to an LPDDR3 input buffer and the referent voltage varies with an on die termination resistor.

In view of above-mentioned embodiments, drift of the output voltage of the amplifier caused by the reference voltage can be compensated. Therefore, the issue illustrated in prior art can be improved.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. The term "first", "second", "third" in following descriptions are only for the purpose of distinguishing different one elements, and do not mean the sequence of the elements. For example, a first device and a second device only mean these devices can have the same structure but are different devices.

Figure 1:
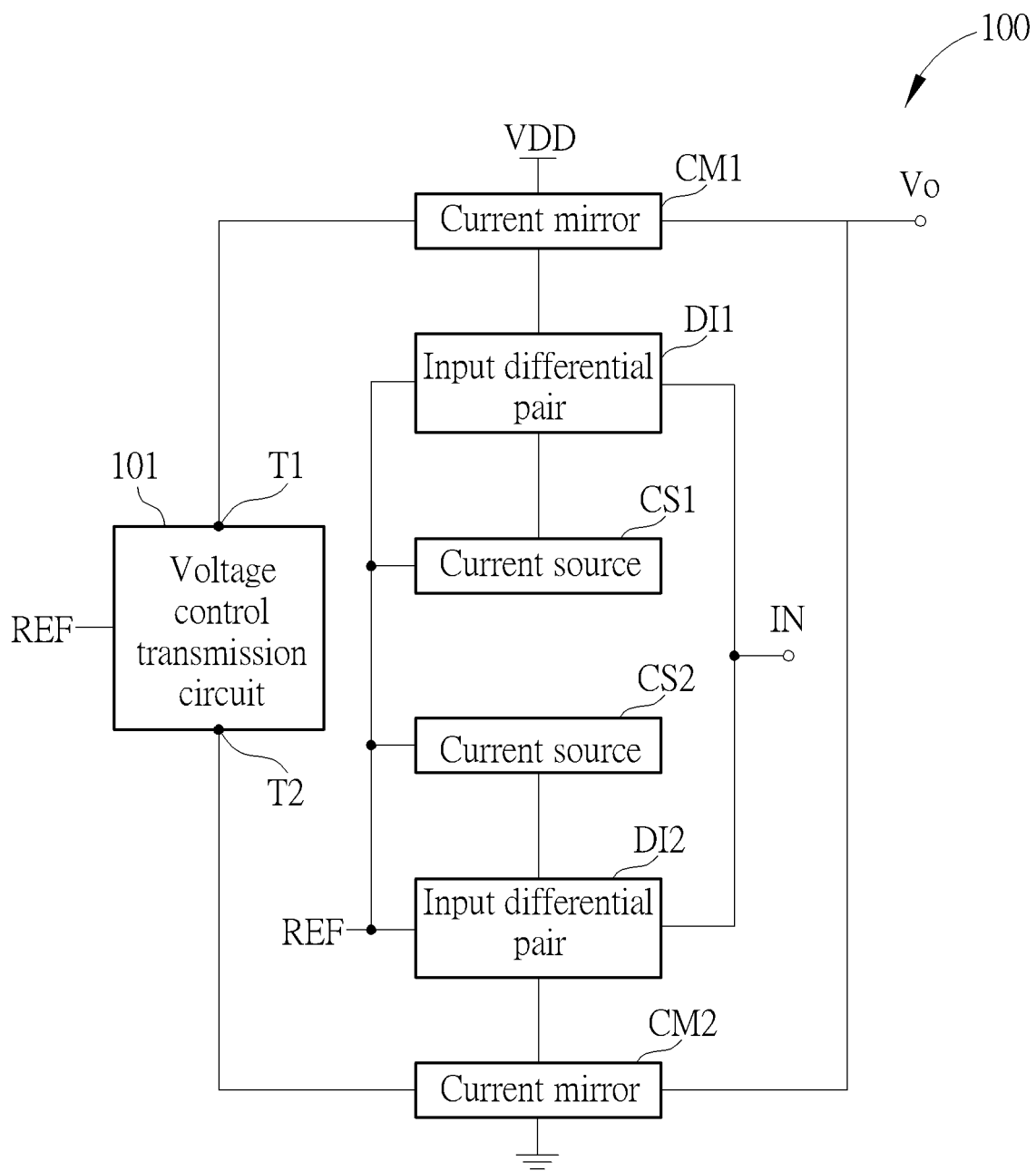
FIG. 1 is a block diagram illustrating an amplifier according to one embodiment of the present invention.

FIG. 1 is a block diagram illustrating an operational amplifier having a wide input stage 100 according to one embodiment of the present invention. The operational amplifier can be generally divided into the input stage 100 and an output stage (not shown). As illustrated in FIG. 1, the input stage 100 comprises: a first current mirror CM1 coupled to a predetermined voltage source VDD, a first input differential pair DI1, a first current source CS1, a second current mirror CM2 coupled to a ground, a second input differential pair DI2, a second current source CS2 and a voltage control transmission circuit 101. The first input differential pair DI1 is coupled to the first current mirror CM1, and the first current source CS1 is coupled to the first input differential pair DI1. The second input differential pair DI2 is coupled to the second current mirror CM2, and the second current source CS2 is coupled to the second input differential pair DI2. The first input differential pair DI1 and the second input differential pair DI2 are configured to receive an input signal IN and a reference voltage REF. The voltage control transmission circuit 101 is controlled by a reference voltage REF.

In operation, an extra current path is formed in the first current mirror CM1, and a current flowing through the extra current path flows through the second current mirror CM2 to the ground when the reference voltage REF is higher than a first predetermined value. Also, an extra current path is formed in the second current mirror CM2, and a current flowing through the extra current path in the second current mirror CM2 flows to the first current mirror CM1 to the predetermined voltage source VDD when the reference voltage REF is lower than a second predetermined value.

In one embodiment, the first predetermined value and the second predetermined value are the turn on/turn off voltages of the transistors in the voltage control transmission circuit 101. Details of the voltage control transmission circuit 101 will be described for more details later.

In one embodiment, the input stage 100 is comprised in an LPDDR3 input buffer. In such case, the reference voltage REF is a reference voltage for DQ, DM inputs and its level is varied with an ODT (on die termination) resistor. The ODT resistor may operate in different modes following LPDDR3 spec, and have different resistance values in different modes. The reference voltage REF varies corresponding to different resistance values of the ODT resistor. As above-mentioned, the variation of the reference voltage REF may cause the drift of the output voltage Vo. In one embodiment, the output voltage Vo is applied as an input of an inverter (not shown), thus the drift of the output voltage Vo may affect the output of the inverter. Via the input stage 100 illustrated in FIG. 1, the output voltage Vo can be compensated to improve the above-mentioned issues.

Figure 2:
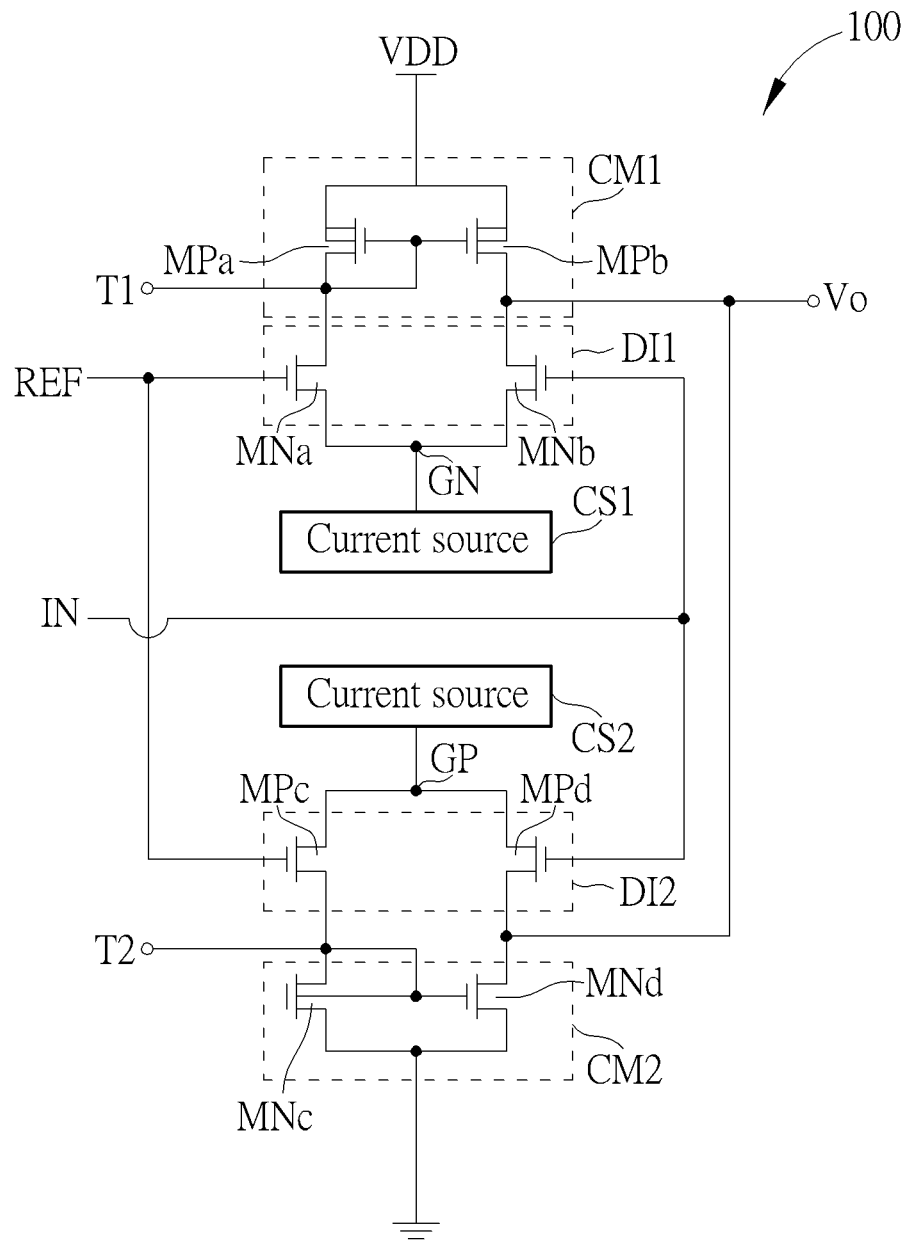
FIG. 2 is a circuit diagram of the amplifier illustrated in FIG. 1, according to one embodiment of the present invention.

FIG. 2 is a circuit diagram of the input stage 100 illustrated in FIG. 1, according to one embodiment of the present invention. Please note FIG. 2 is only an example. The circuits which can perform the same function should also fall in the scope of the present invention. As illustrated in FIG. 2, the first current mirror CM1 comprises PMOSs MPa, MPb, and the second current mirror CM2 comprises NMOSs MNc, MNd. The operational amplifier includes the input stage 100 having a wide input range, composed of the differential transistor pair formed of NNOS MNa and MNb and the differential transistor pair formed of the PMOS MPc and MPd, these differential transistor pairs being connected in parallel to receive the input signals IN and REF in parallel to each other.

In the embodiment of FIG. 2, gates of the PMOSs MPa, MPb are coupled to a terminal T1 of the voltage control transmission circuit 101 shown in FIG. 1, and the gates of the NMOSs MNc, MNd are coupled to a terminal T2 of the voltage control transmission circuit 101. The PMOSs MPa, MPb, NMOSs MNc, MNd can be replaced by other kinds of transistors. Therefore, such connections can be described as: the first current mirror CM1 comprises a plurality of transistors and the voltage control transmission circuit 101 is coupled to control terminals (e.g., gate terminal) of the transistors. Further, such connections can be regarded as: the second current mirror CM2 comprises a plurality of transistors and the voltage control transmission circuit 101 is coupled to control terminals of the transistors.

Figure 3:
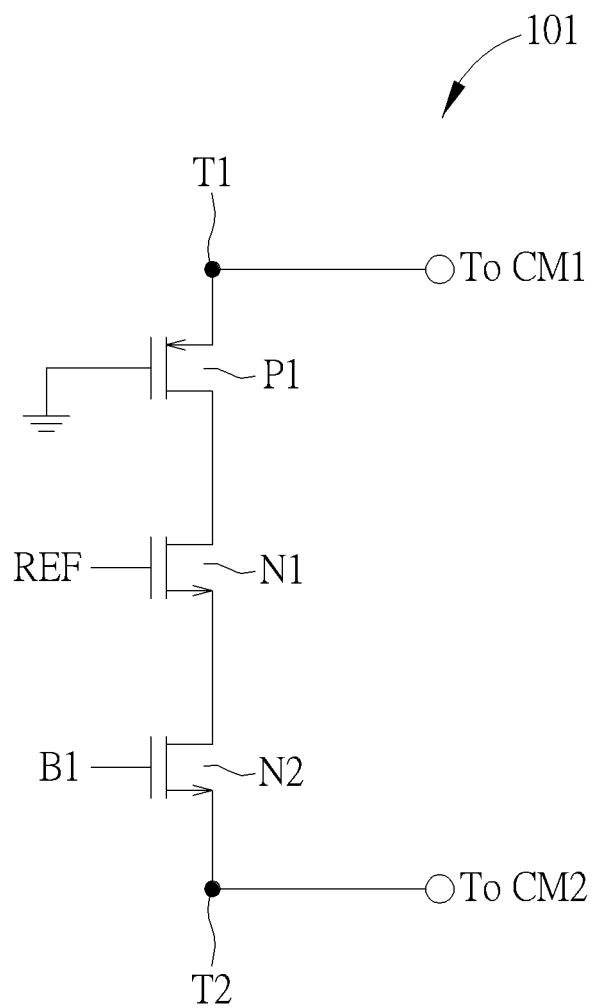
FIG. 3 is a circuit diagrams of the voltage control transmission circuit illustrated in FIG. 1, according to an embodiment of the present invention.
Figure 5:
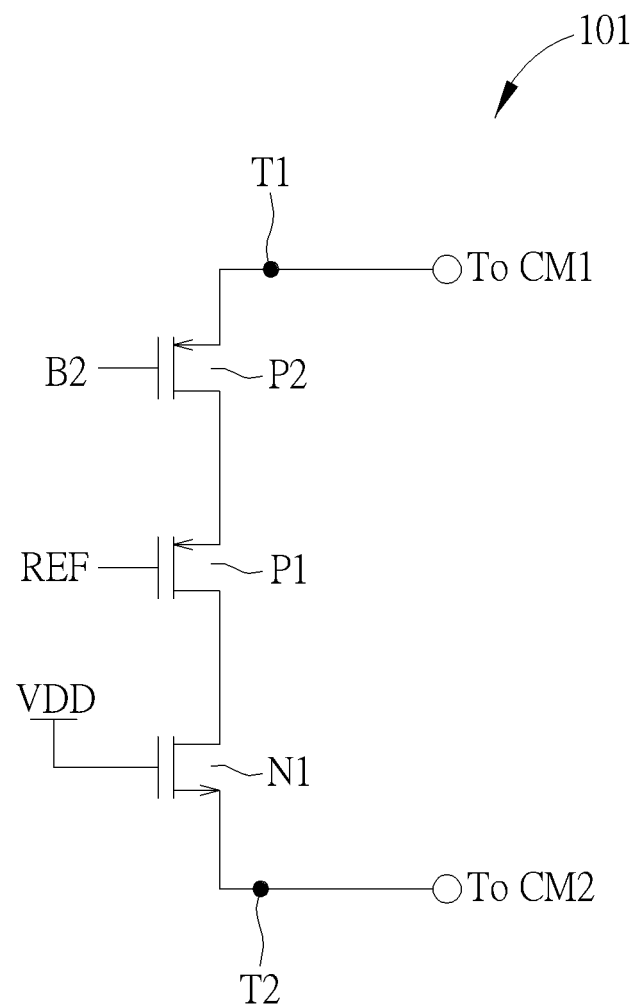
FIG. 5 is a circuit diagrams of the voltage control transmission circuit illustrated in FIG. 1, according to another embodiment of the present invention.

The voltage control transmission circuit 101 is configured to control a short level between terminals T1, T2 and can have various structures. FIG. 3 and FIG. 5 are circuit diagrams of the voltage control transmission circuit illustrated in FIG. 1, according to different embodiments of the present invention. FIG. 3 is a circuit diagram of the voltage control transmission circuit 101 which forms a transmission path, which serves the above-mentioned extra current path, when the reference voltage REF is between VDD/2 and VDD, to decrease the output voltage Vo. As illustrated in FIG. 3, the voltage control transmission circuit 101 comprises a PMOS P1, an NMOS N1, and an NMOS N2. The NMOS N1 is controlled by the reference voltage REF to turn on or turn off. Specifically, the NMOS N1 turns on when the reference voltage REF is higher than the first predetermined value.

The PMOS P1 is coupled between the first current mirror CM_1 and the NMOS N1, and is coupled to a ground voltage level. Specifically, a source terminal of the PMOS P1 is served as the terminal T1 illustrated in FIG. 1, and a gate terminal of the PMOS P1 is coupled to the ground voltage level. The NMOS N2 is biased by a first bias voltage B1, coupled between the NMOS N1 and the second current mirror CM2. Also, in the embodiment of FIG. 3, the source terminal of the NMOS N2 is served as the terminal T2 illustrated in FIG. 1.

In one embodiment, in operation, the first bias voltage B1 is decreased to a lower voltage such as 0.75*VDD in order to reduce the short level between terminals T1, T2, when the reference voltage REF increases to be between 0.5*VDD and VDD. For more detail, the on resistance of the NMOS N2 is increased due to the lower first bias voltage B1, and the short level between terminals T1, T2 is limited accordingly. In such design, if the reference voltage REF increases to be between 0.5*VDD and 0.75*VDD, the short level between the terminals T1, T2 is controlled by the reference voltage REF. Also, if the reference voltage REF further increases to be between 0.75*VDD and VDD, the short level between the terminals T1, T2 is clamped by the first bias voltage B1 which is 0.75*VDD.

Besides, in order to avoid the influence caused process drift, the voltage control transmission circuit 101 further comprises a PMOS P1, to compensate the short level of the terminals T1, T2 in a situation that the NMOS turns on too much and the PMOS turns on too less.

The PMOS P1, the NMOS N1, and the NMOS N2 can be replaced by other kinds of transistors. Therefore, the embodiment illustrated in FIG. 3 can be described as: a first type one transistor (e.g., the NMOS N1), controlled by the reference voltage REF to turn on or turn off, wherein the first type one transistor turns on when the reference voltage REF is higher than the first predetermined value; a first type two transistor (e.g., the PMOS P1), coupled between the first current mirror CM1 and the first type one transistor, and coupled to a ground voltage level. A second type one transistor (the NMOS N2) can be further comprised, which is biased by a first bias voltage B1, coupled between the first type one transistor and the second current mirror CM2.

Figure 4:
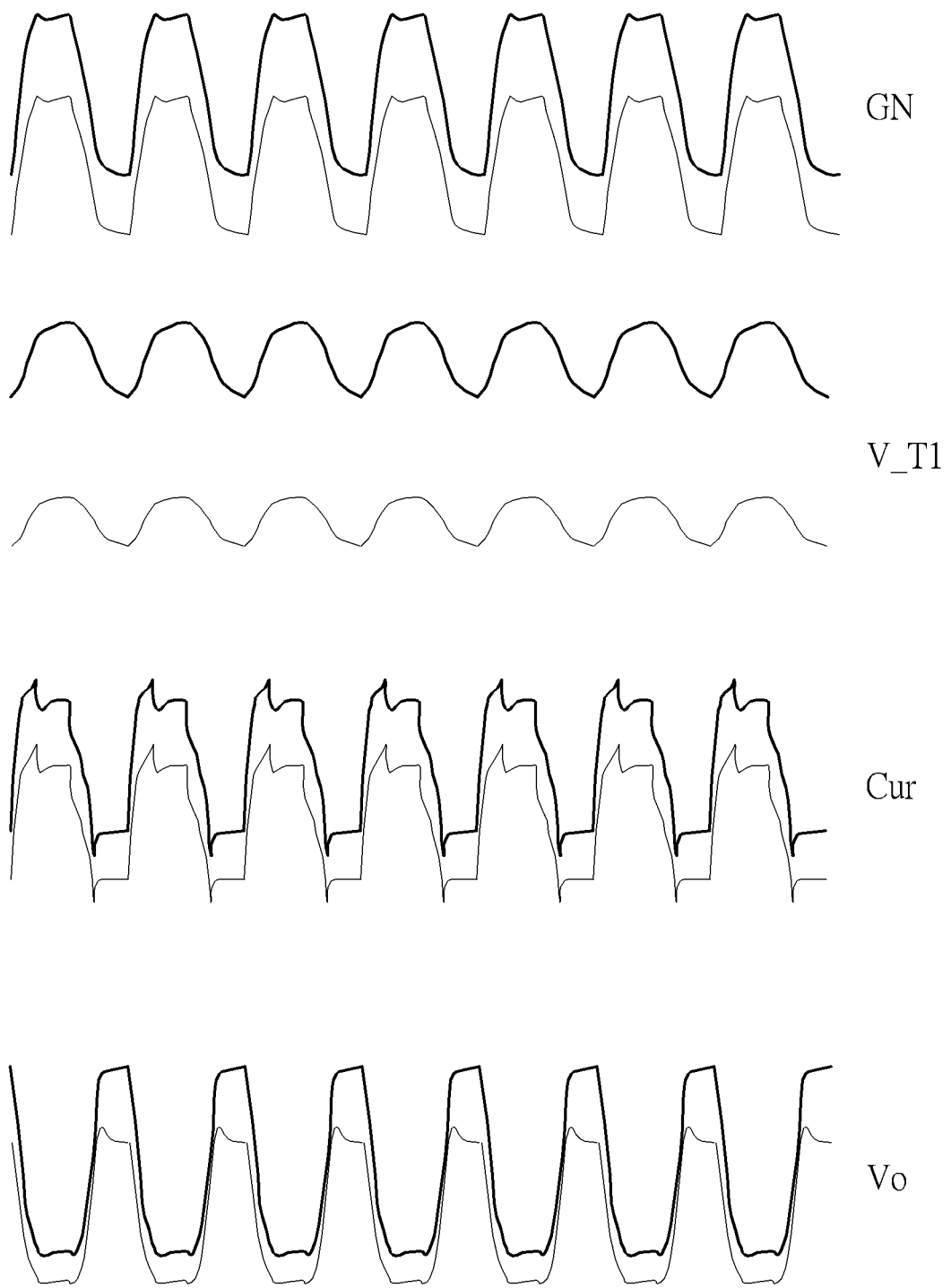
FIG. 4 is a wave chart illustrating the operation of the amplifier illustrated in FIG. 2, according to one embodiment of the present invention.

FIG. 4 is a wave chart illustrating the operation of the input stage 100 illustrated in FIG. 2, according to one embodiment of the present invention, which corresponds to the embodiment illustrated in FIG. 3. GN is the voltage at the source terminal of the NMOSs MNa, MNb in FIG. 2, V_T1 is the voltage at the terminal T1, Cur are currents flowing through the NMOSs MNa, MNb, and Vo means the above-mentioned output voltage Vo. Also, the upper waves are the waves when the voltage control transmission circuit 101 does not form a transmission path (i.e., the terminals T1 and T2 are open). For example, the NMOS N1 in FIG. 3 or the PMOS P1 in FIG. 4 turns off. On the opposite, the lower waves are the waves when the voltage control transmission circuit 101 forma transmission path (i.e., the terminals T1 and T2 are short). For example, the NMOS N1 in FIG. 3 or the PMOS P1 in FIG. 4 turns on.

As shown in FIG. 4, GN, V_T1, Cur rise up when the reference voltage REF increases. The output voltage Vo also rises up when the reference voltage REF increases and the terminals T1 and T2 are open. However, the output voltage Vo is pulled down when the terminals T1 and T2 are short. In view of the descriptions of FIG. 2, when the reference voltage is higher than the first predetermined value, an extra current path in the first current mirror CM1 is formed since the terminals T1 and T2 are short. The current flowing through the extra current path in the first current mirror CM1 flows through the second current mirror CM2 to the ground. By this way, the current flowing through the PMOS MPa increases, such that the voltage VSG of the PMOS MPa increases. A large voltage VSG of the PMOS MPa suppresses the voltage VDS of the NMOS MNa, thus a current flowing through the NMOS MNa decreases, and the voltage GN becomes lower. Accordingly, the output voltage Vo is pulled down. Besides, if a voltage at the terminal T2 increases, the output voltage Vo is directly pulled down.

Contrary to the embodiment illustrated in FIG. 3, FIG. 5 is a circuit diagram of the voltage control transmission circuit 101 which a transmission path when the reference voltage REF is between 0 and VDD/2, to increase the output voltage Vo. As illustrated in FIG. 5, the voltage control transmission circuit 101 comprises an NMOS N1, a PMOS P1, and a PMOS P2. The PMOS P1 is controlled by the reference voltage REF to turn on or turn off. Specifically, the PMOS P1 turns on when the reference voltage REF is lower than the second predetermined value.

The NMOS N1 is coupled between the second current mirror CM_2 and the PMOS P1, and is coupled to VDD, which is an operating voltage of the amplifier 100 illustrated in FIG. 1. Specifically, a source terminal of the NMOS N1 is served as the terminal T2 illustrated in FIG. 1, and a gate terminal of the NMOS N1 is coupled to the VDD. The PMOS P2 is biased by a second bias voltage B2, coupled between the PMOS P1 and the first current mirror CM1. Also, in the embodiment of FIG. 5, the source terminal of the PMOS P2 is served as the terminal T1 illustrated in FIG. 1.

In one embodiment, in operation, if the reference voltage REF decreases to be between 0.5*VDD and GND, the bias voltage B2 can be increased in order to reduce the short level between the terminals T1 and T2. For example, the bias voltage B2 can be pulled up to 0.25*VDD to increase the on resistance of the PMOS P2, and the short level between terminals T1 and T2 is accordingly suppressed.

Besides, in order to avoid the influence caused process drift. The voltage control transmission circuit 101 further comprises an NMOS N1, to compensate the short level of the terminals T1, T2 in a situation that the NMOS turns on too less and/or the PMOS turns on too much.

The NMOS N1, the PMOS P1, and the PMOS P2 can be replaced by other kinds of transistors. Therefore, the embodiment illustrated in FIG. 5 can be described as: a first type two transistor (e.g., the PMOSP1), controlled by the reference voltage REF to turn on or turn off, wherein the first type two transistor turns on when the reference voltage is lower than the second predetermined value; a first type one transistor (e.g., the NMOS N1), coupled between the second current mirror CM2 and the first type two transistor, and coupled to a predetermined value level (e.g., VDD). The second type two transistor P2 is biased by a second bias voltage B2, coupled between the first type two transistor and the first current mirror CM1.

In view of the descriptions of FIG. 2, when the reference voltage is lower than the second predetermined value, an extra current path in the second current mirror CM2 is formed since the terminals T1 and T2 are short. The current flowing through the extra current path in the second current mirror CM2 flows through the first current mirror CM1 to the predetermine voltage source VDD. By this way, the current flowing through the NMOS MNc increases, such that the voltage VGS of the NMOS MNc increases. A large voltage VSG of the NMOS MNc suppresses the voltage VSD of the PMOS MPc, thus a current flowing through the PMOS MPc decreases, and the voltage GN becomes higher. Accordingly, the output voltage Vo is pulled up. Besides, if a voltage at the terminal T1 decreases, the output voltage Vo is directly pulled up.

In view of above-mentioned embodiments, drift of the output voltage of the amplifier caused by the reference voltage can be compensated. Therefore, the issue illustrated in prior art can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier with an input stage, wherein the input stage comprises:
   a first current mirror, coupled to a predetermine voltage source;
   a first input differential pair, coupled to the first current mirror;
   a first current source, coupled to the first input differential pair;
   a second current source;
   a second input differential pair, coupled to the second current source, wherein the first input differential pair and the second input differential pair are configured to receive a reference voltage;
   a second current mirror, coupled to the second input differential pair and a ground; and
   a voltage control transmission circuit, controlled by a reference voltage, wherein an extra current path in the first current mirror is formed and a current flowing through the extra current path flows through the second current mirror to the ground when the reference voltage is higher than a first predetermined value, wherein an extra current path in the second current mirror is formed and a current flowing through the extra current path in the second current mirror flows to the first current mirror to the predetermined voltage source when the reference voltage is lower than a second predetermined value.

2. The amplifier of claim 1, wherein the voltage control transmission circuit comprises:
   a first type one transistor, controlled by the reference voltage to turn on or turn off, wherein the first type one transistor turns on when the reference voltage is higher than the first predetermined value.

3. The amplifier of claim 2, wherein the voltage control transmission circuit further comprises:
   a first type two transistor, coupled between the first current mirror and the first type one transistor, and coupled to the ground.

4. The amplifier of claim 3, wherein the first current mirror comprises a plurality of transistors and the first type two transistor is coupled to control terminals of the transistors.

5. The amplifier of claim 3, further comprising:
   a second type one transistor, biased by a first bias voltage, coupled between the first type one transistor and the second current mirror.

6. The amplifier of claim 1, wherein the voltage control transmission circuit comprises:
   a first type two transistor, controlled by the reference voltage to turn on or turn off, wherein the first type two transistor turns on when the reference voltage is lower than the second predetermined value.

7. The amplifier of claim 6, wherein the voltage control transmission circuit further comprises:
   a first type one transistor, coupled between the second current mirror and the first type two transistor, and coupled to the predetermined voltage source.

8. The amplifier of claim 6, wherein the second current mirror comprises a plurality of transistors and the first type one transistor is coupled to control terminals of the transistors.

9. The amplifier of claim 6, further comprising:
a second type two transistor, biased by a second bias voltage, coupled between the first type two transistor and the first current mirror.

10. An LPDDR3 input buffer, comprising:
an amplifier with an input stage, wherein the input stage comprises:
a first current mirror, coupled to a predetermine voltage source;
a first input differential pair, coupled to the first current mirror;
a first current source, coupled to the first input differential pair;
a second current source;
a second input differential pair, coupled to the second current source, wherein the first input differential pair and the second input differential pair are configured to receive a reference voltage;
a second current mirror, coupled to the second input differential pair and a ground; and
a voltage control transmission circuit, controlled by a reference voltage varying with an on die termination resistor, wherein an extra current path in the first current mirror is formed and a current flowing through the extra current path flows through the second current mirror to the ground when the reference voltage is higher than a first predetermined value, wherein an extra current path in the second current mirror is formed and a current flowing through the extra current path in the second current mirror flows to the first current mirror to the predetermined voltage source when the reference voltage is lower than a second predetermined value.

11. The LPDDR3 input buffer of claim 10, wherein the voltage control transmission circuit comprises:
a first type one transistor, controlled by the reference voltage to turn on or turn off, wherein the first type one transistor turns on when the reference voltage is higher than the first predetermined value.

12. The LPDDR3 input buffer of claim 11, wherein the voltage control transmission circuit further comprises:
a first type two transistor, coupled between the first current mirror and the first type one transistor, and coupled to the ground.

13. The LPDDR3 input buffer of claim 12, wherein the first current mirror comprises a plurality of transistors and the first type two transistor is coupled to control terminals of the transistors.

14. The LPDDR3 input buffer of claim 12, further comprising:
a second type one transistor, biased by a first bias voltage, coupled between the first type one transistor and the second current mirror.

15. The LPDDR3 input buffer of claim 10, wherein the voltage control transmission circuit comprises:
a first type two transistor, controlled by the reference voltage to turn on or turn off, wherein the first type two transistor turns on when the reference voltage is lower than the second predetermined value.

16. The LPDDR3 input buffer of claim 15, wherein the voltage control transmission circuit further comprises:
a first type one transistor, coupled between the second current mirror and the first type two transistor, and coupled to the predetermined voltage source.

17. The LPDDR3 input buffer of claim 15, wherein the second current mirror comprises a plurality of transistors and the first type one transistor is coupled to control terminals of the transistors.

18. The LPDDR3 input buffer of claim 15, further comprising:
a second type two transistor, biased by a second bias voltage, coupled between the first type two transistor and the first current mirror.

* * * * *